United States Patent
Cheng et al.

(10) Patent No.: US 11,574,837 B2
(45) Date of Patent: Feb. 7, 2023

(54) ROBOT BLADE HAVING MULTIPLE SENSORS FOR MULTIPLE DIFFERENT ALIGNMENT TASKS

(71) Applicant: Taiwan Semiconductor Manufacturing Co., Ltd., Hsinchu (TW)

(72) Inventors: Wen-Hao Cheng, Hsinchu (TW); Yen-Yu Chen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 168 days.

(21) Appl. No.: 16/900,558

(22) Filed: Jun. 12, 2020

(65) Prior Publication Data
US 2021/0391206 A1 Dec. 16, 2021

(51) Int. Cl.
| | |
|---|---|
| *H01L 21/68* | (2006.01) |
| *H01L 21/687* | (2006.01) |
| *B25J 11/00* | (2006.01) |
| *B25J 13/08* | (2006.01) |
| *H01L 21/683* | (2006.01) |

(52) U.S. Cl.
CPC ..... *H01L 21/68707* (2013.01); *B25J 11/0095* (2013.01); *B25J 13/089* (2013.01); *H01L 21/68* (2013.01); *H01L 21/6833* (2013.01); *H01L 21/6838* (2013.01)

(58) Field of Classification Search
CPC .............. H01L 21/68707; H01L 21/68; H01L 21/6833; H01L 21/6838; H01L 21/67742; H01L 21/67748; H01L 21/6831; B25J 11/0095; B25J 13/089; B25J 15/0014; B25J 15/0085; B25J 15/0616; B25J 9/00; B25J 13/08; B25J 15/00
See application file for complete search history.

(56) References Cited

U.S. PATENT DOCUMENTS

| | | | |
|---|---|---|---|
| 10,343,292 B2 | 7/2019 | Bogner | |
| 2003/0155234 A1* | 8/2003 | Feltsman | C23C 14/566 118/712 |
| 2005/0096794 A1* | 5/2005 | Yim | H01L 21/67766 700/258 |
| 2005/0102064 A1* | 5/2005 | Donoso | H01L 21/67259 700/254 |
| 2009/0182454 A1* | 7/2009 | Donoso | H01L 21/681 700/254 |
| 2009/0279989 A1* | 11/2009 | Wong | H01L 21/68 414/217 |
| 2017/0018446 A1* | 1/2017 | Yin | H01L 21/68707 |
| 2019/0287834 A1* | 9/2019 | Woo | H01L 21/67766 |

(Continued)

FOREIGN PATENT DOCUMENTS

| | | |
|---|---|---|
| CN | 106062941 A | 10/2016 |
| CN | 106956290 B | 9/2019 |

(Continued)

*Primary Examiner* — Mohammed Shamsuzzaman
(74) *Attorney, Agent, or Firm* — Seed IP Law Group LLP

(57) ABSTRACT

A robot for transferring a wafer is disclosed. A blade of the robot includes a first sensor on an upper surface of the blade and the second sensor on a back surface of the blade. The first sensor is operable to align the blade with a wafer. The second sensor is operable to align the blade with a holder that holds the wafer.

12 Claims, 15 Drawing Sheets

(56) References Cited

U.S. PATENT DOCUMENTS

| | | | | |
|---|---|---|---|---|
| 2020/0024726 | A1* | 1/2020 | Moradian | H01L 21/67184 |
| 2021/0007281 | A1* | 1/2021 | Smith | B25J 5/00 |
| 2021/0146554 | A1* | 5/2021 | Hudgens | H01L 21/67754 |
| 2021/0172728 | A1* | 6/2021 | Waqar | H01L 21/67253 |
| 2021/0378119 | A1* | 12/2021 | Criminale | H05K 5/069 |
| 2022/0057323 | A1* | 2/2022 | Egan | G01B 11/303 |

FOREIGN PATENT DOCUMENTS

| | | | | | |
|---|---|---|---|---|---|
| JP | 2014003335 | A | * | 1/2014 | G03F 7/70341 |
| KR | 100366264 | B1 | * | 3/2001 | H01L 21/68707 |
| KR | 20070037790 | A | * | 10/2005 | H01L 21/67742 |
| WO | WO-2021086745 | A1 | * | 5/2021 | B25J 13/088 |

* cited by examiner

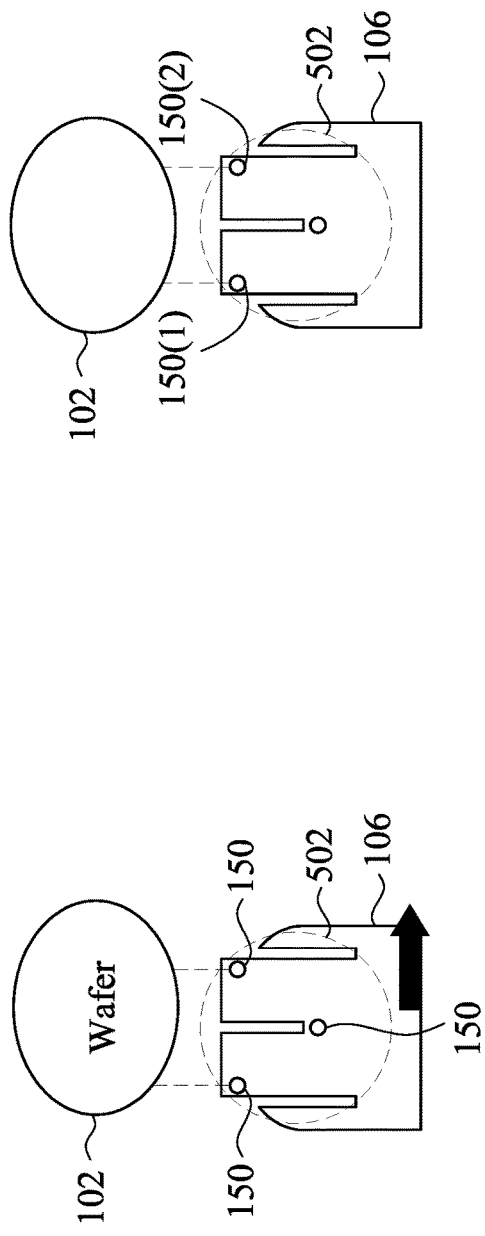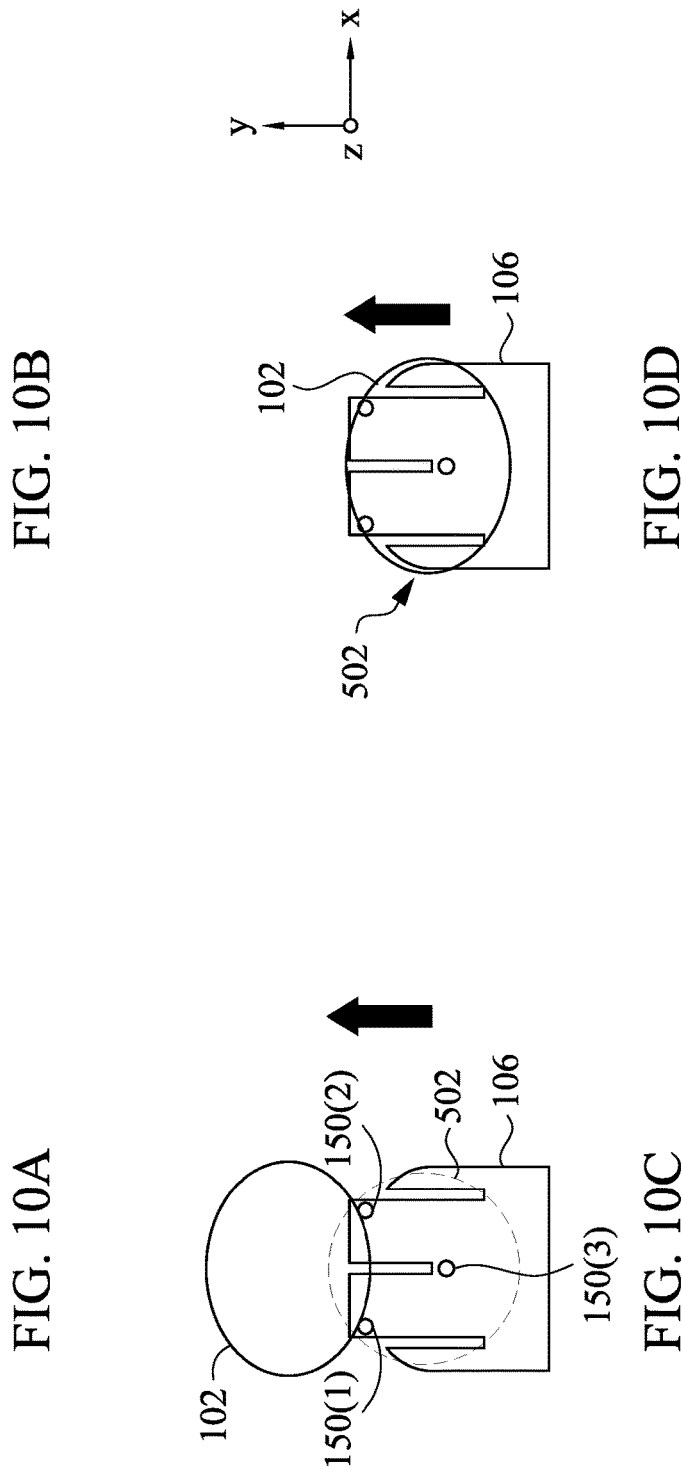

US 11,574,837 B2

ROBOT BLADE HAVING MULTIPLE SENSORS FOR MULTIPLE DIFFERENT ALIGNMENT TASKS

BACKGROUND

In the manufacture of semiconductor devices, robots are often utilized to transfer a workpiece, such as a silicon wafer, between various processing apparatuses. In some system architectures, a workpiece carrier is mounted to an arm of the robot, wherein the workpiece carrier is configured to transport the workpiece between the processing apparatuses.

One common workpiece carrier includes a robot blade coupled to an end of the robot, wherein a workpiece rests on the robot blade during transportation thereof by the robot. Typically, gravity maintains the position of the workpiece with respect to the robot blade. As such, inertial forces of the workpiece with respect to the robot blade tend to limit a speed of travel of the robot blade. Further conventional approaches include a vacuum source on the robot arm, wherein the robot blade utilizes the vacuum source to maintain the position of the workpiece relative to the robot blade. For example, the vacuum source is plumbed to the robot blade in order to selectively provide a vacuum to an interface between the workpiece and the robot blade, thereby selectively fixing the position of the workpiece with respect to the robot blade. Furthermore, electrostatic forces are used to attract a workpiece to a workpiece retaining surface of a robot blade, which is typically made of a dielectric.

BRIEF DESCRIPTION OF THE DRAWINGS

Aspects of the present disclosure are best understood from the following detailed description when read with the accompanying figures. In the drawings, identical reference numbers identify similar elements or acts unless the context indicates otherwise. The sizes and relative positions of elements in the drawings are not necessarily drawn to scale. In fact, the dimensions of the various features may be arbitrarily increased or reduced for clarity of discussion.

FIGS. 10A-10F illustrate example steps of positioning a wafer on a blade according to embodiments of the disclosure.

DETAILED DESCRIPTION

Figure 1:
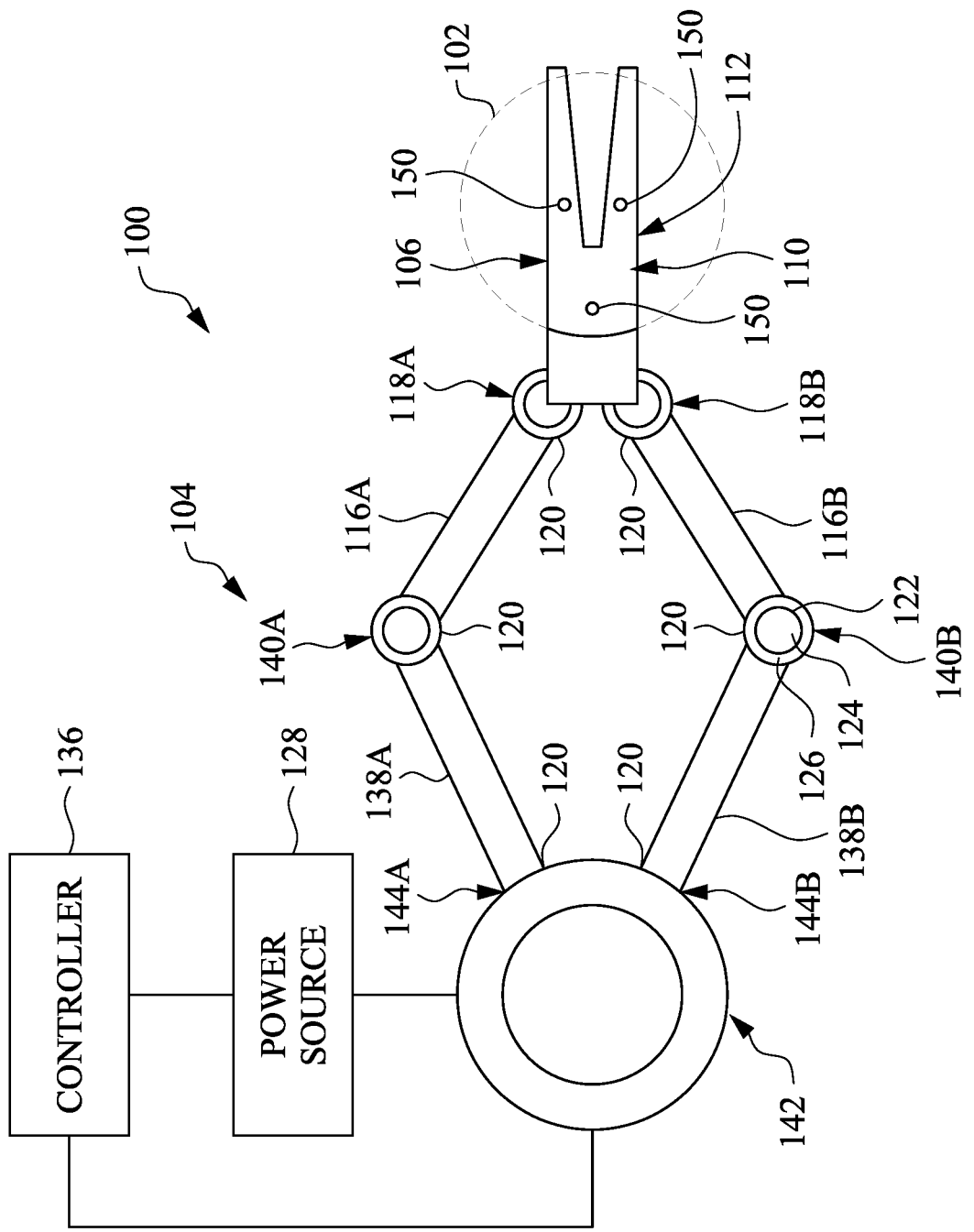
FIG. 1 illustrates an example robot having a blade according to embodiments of the disclosure.

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure. Throughout the various views and illustrative embodiments, like reference numerals are used to designate like elements. Reference will now be made in detail to exemplary embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, an apparatus in accordance with the present disclosure. It is to be understood that elements not specifically shown or described may take various forms. Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates one aspect of the disclosure, wherein a workpiece transfer system 100 is provided. The workpiece transfer system 100, for example, is configured to selectively transfer a workpiece 102 (shown in dotted line) from one location to another, such as between processing apparatuses (not shown) of a semiconductor fabrication process. In some embodiments with the present disclosure, the workpiece transfer system 100 comprises a robot 104, as will be discussed hereafter.

The robot 104, for example, comprises a blade 106, wherein the blade is configured to selectively retain or hold the workpiece 102. The blade 106, in accordance with some aspects of the disclosure, comprises one or more electrodes 108 (shown in FIG. 2) associated with a dielectric workpiece retaining surface 110. The one or more electrodes 108 and the dielectric workpiece retaining surface 110 generally define an electrostatic chuck 112. As illustrated schematically in FIG. 2, the one or more electrodes 108 of the electrostatic chuck 112 are generally embedded in a dielectric layer 114 (e.g., a ceramic), wherein a voltage supplied to the one or more electrodes electrostatically attracts the workpiece 102 to the dielectric workpiece retaining surface 110.

In accordance with some example embodiments, the robot 104 comprises a first pair of arms 116A, 116B respectively rotatably coupled to the blade 106 via a first pair 118A, 118B of a plurality of joints 120. The plurality of joints 120, for example, each comprise a bearing 122, a primary transformer coil 124, and a secondary transformer coil 126. The bearing 122 of each joint 120 rotatably couples the primary transformer coil 124 to the secondary transformer coil 126 of the respective joint. In one example, power (e.g., voltage from a power source 128 of FIG. 1) provided to one of the primary transformer coil 124 and secondary transformer coil 126 of each joint 120 produces mutual inductance between the primary transformer coil and secondary transformer coil of the respective joint 120, therein providing contactless power across each joint 120.

The first pair of arms 116A, 116B, for example, generally permits the blade 106 to rotate with respect to the first pair of arms. The primary transformer coil 124 of each of the first pair 118A, 118B of the plurality of joints 120 is operably coupled to the respective first pair of arms 116A, 116B, and the secondary transformer coil 126 of each of the first pair of the plurality of joints is operably coupled to the blade 106. Accordingly, the one or more electrodes 108 on the blade 106 are electrically coupled in a contactless manner to the first pair of arms 116A, 116B.

The workpiece transfer system 100, for example, further comprises a controller 136, wherein the controller 136 is configured to selectively energize the one or more electrodes 108 by selectively activating the power source 128. Thus, the mutual inductance between the primary transformer coil 124 and secondary transformer coil 126 of each joint 120 provides contactless power through each joint from the power source 128 to the one or more electrodes 108, therein selectively electrostatically charging the dielectric workpiece retaining surface 110 of the electrostatic chuck 112. The controller 136, for example, is further configured to switch a polarity of the power from the power source 128 (e.g., from positive to negative DC voltage), therein selectively charging and discharging the dielectric workpiece retaining surface 110.

In accordance with some example embodiments, the robot 104 of the workpiece transfer system 100, further comprises a second pair of arms 138A, 138B respectively rotatably coupled to the first pair of arms 116A, 116B, via a second pair 140A, 140B of the plurality of joints 120. Accordingly, the primary transformer coil 124 of each of the second pair 140A, 140B of the plurality of joints 120 is operably coupled to the respective second pair of arms 138A, 138B, and the secondary transformer coil 126 of each of the second pair of the plurality of joints is operably coupled to the respective first pair of arms 116A, 116B.

According to some example embodiments, the robot 104 further comprises a robot base 142 rotatably coupled to the second pair of arms 138A, 138B via a third pair 144A, 144B of the plurality of joints 120. The primary transformer coil 124 of each of the third pair 144A, 144B of the plurality of joints 120 is thus operably coupled to the robot base 142, and the secondary transformer coil 126 of each of the third pair of the plurality of joints is operably coupled to the respective second pair of arms 138A, 138B. Thus, again, the mutual inductance between the primary transformer coils 124 and secondary transformer coils 126 of each joint 120 provides contactless power through each joint from the power source 128 to the one or more electrodes 108, thereby selectively electrostatically charging the dielectric workpiece retaining surface 110 of the electrostatic chuck 112.

In some embodiments, the power source 128 is controlled, e.g., by the controller 136, to provide variable power values at different electrodes 108 such that different electrostatic charges are generated at different surface regions of the dielectric workpiece retaining surface 110. The different electrostatic charges are used to prevent warpage of the workpiece 102 or to control the position of the workpiece 102 on the blade 106. For example, the electrostatic charges are controlled so that the workpiece 102 are chunked by different portions thereof, details of which are further described herein.

Figure 2:
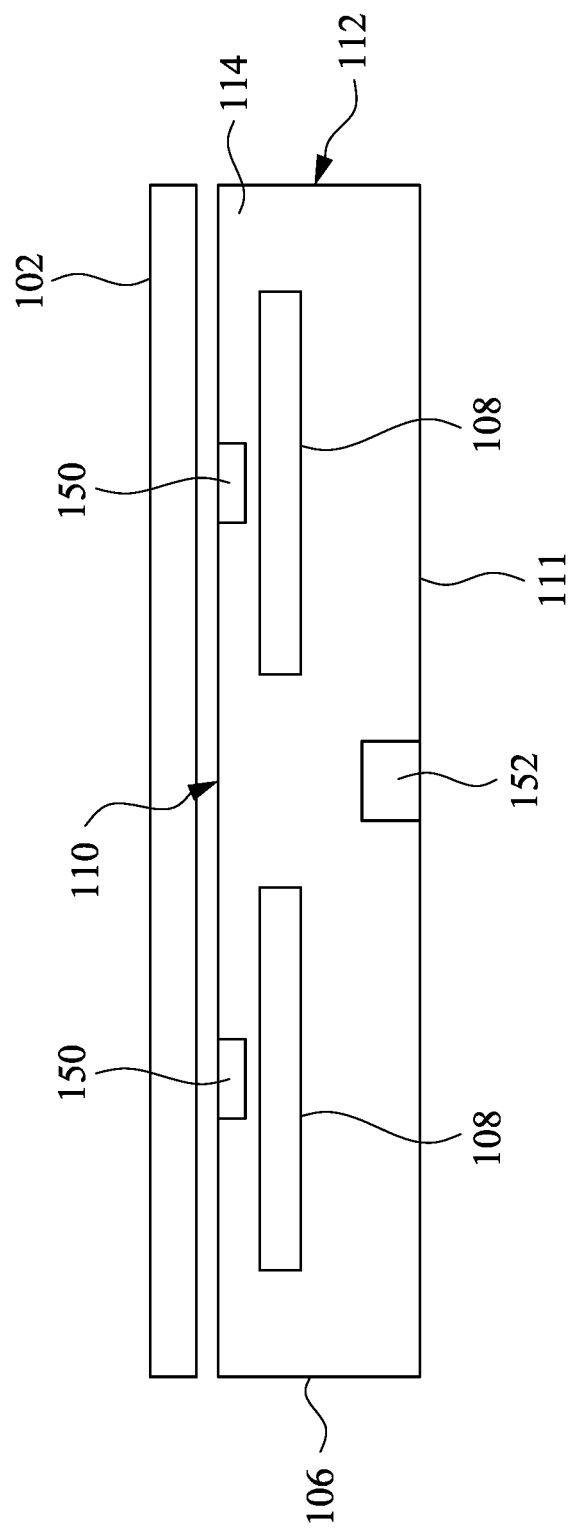
FIG. 2 illustrates an example blade according to embodiments of the disclosure.

Referring to FIGS. 1 and 2 together, in some embodiments, the blade 106 includes multiple alignment sensors 150, 152. The alignments sensor(s) 150, three are shown as illustrative examples, is positioned adjacent to, e.g., on or embedded in, the workpiece retaining surface 110 of the blade 106 and are configured to align the blade 106 with the workpiece 102 that is transferred to the blade 106. The alignment sensor(s) 152, one is shown as an illustrative example, is positioned adjacent to a back surface 111 of the blade 106 and is configured to align the blade with a holder (not shown in FIG. 2), e.g., of a chamber of processing the workpiece 102, that receives the workpiece 102 from the blade 106 or robot 104. The alignment sensor 152 also aligns blade 106 with a holder of the workpiece 102, from which the blade 106 receives the workpiece 102.

The sensors 150, 152 each is an infrared sensor, a time-of-flight sensor, a magnetic sensors, a laser sensor, a LED alignment sensor, or other suitable sensors that detect or calibrate alignment between two objects. The sensors 150, 152 may be buried within the blade 106, partially embedded in the respective surfaces 110, 111 or positioned on the respective surfaces 110, 111.

Figure 3:
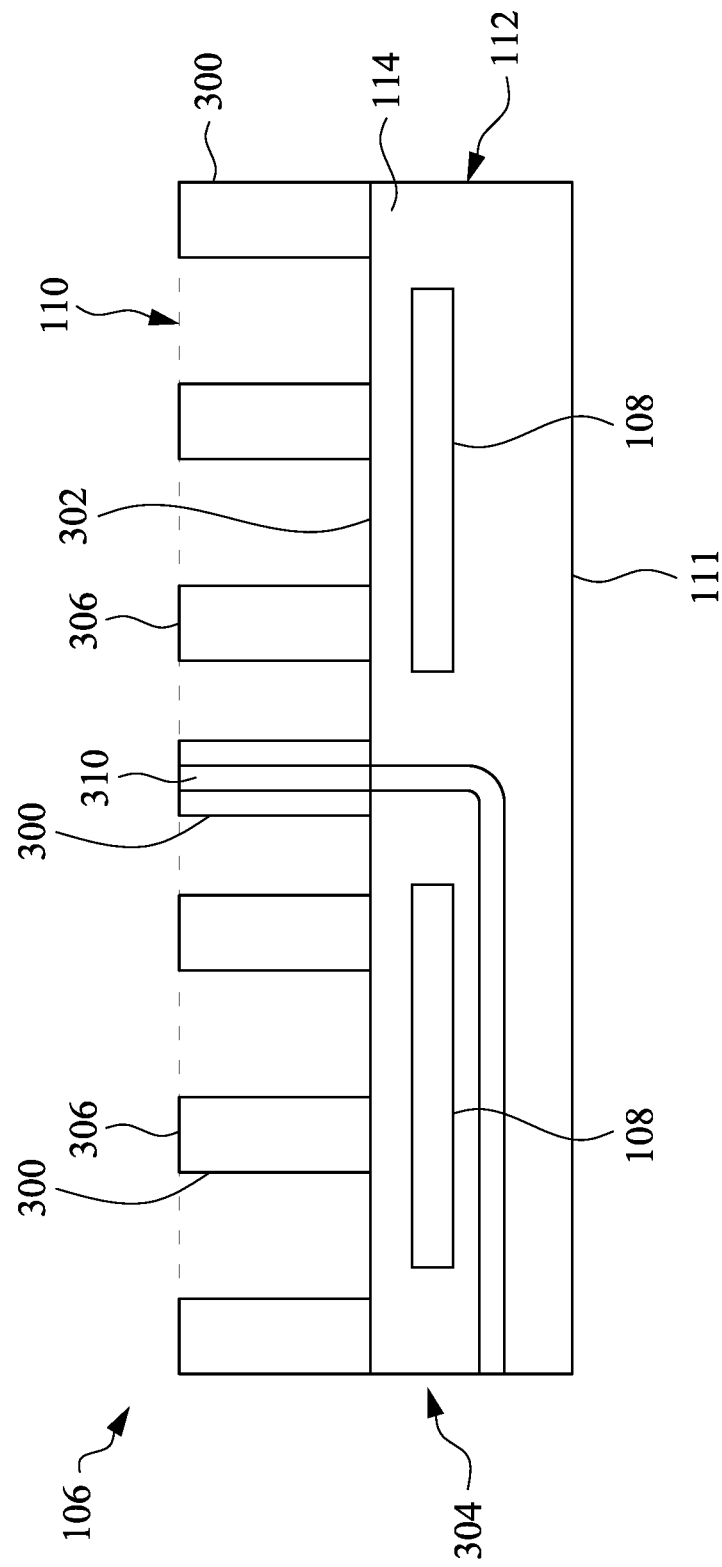
FIG. 3 illustrates another example blade according to embodiments of the disclosure.

FIG. 3 shows some embodiments of the blade 106. The blade 106 includes a plurality of discrete column structures 300 extending upwardly from an upper surface 302 of a body 304 of the chunk 112. The discrete column structures 300 are made of a dielectric material, e.g., a polyimide or a polymeric resin material, and have a shape/profile of a prong, a spike, a tooth, a tine, a pillar or a column. The cross-sectional profile of the column structures 300, in a cross-sectional view as shown in FIG. 3, may be rectangle, trapezoid, parallelogram, kite, rhombus, or variants thereof, or other polygonal shapes or variants thereof. The cross-sectional profile of the column structures 300 may also be circular, ovular or other suitable shapes.

In the embodiment of FIG. 3, upper surfaces 306 of the discrete column structures 300 form the upper surface 110 (shown with dotted line) of the blade 106

Figure 4:
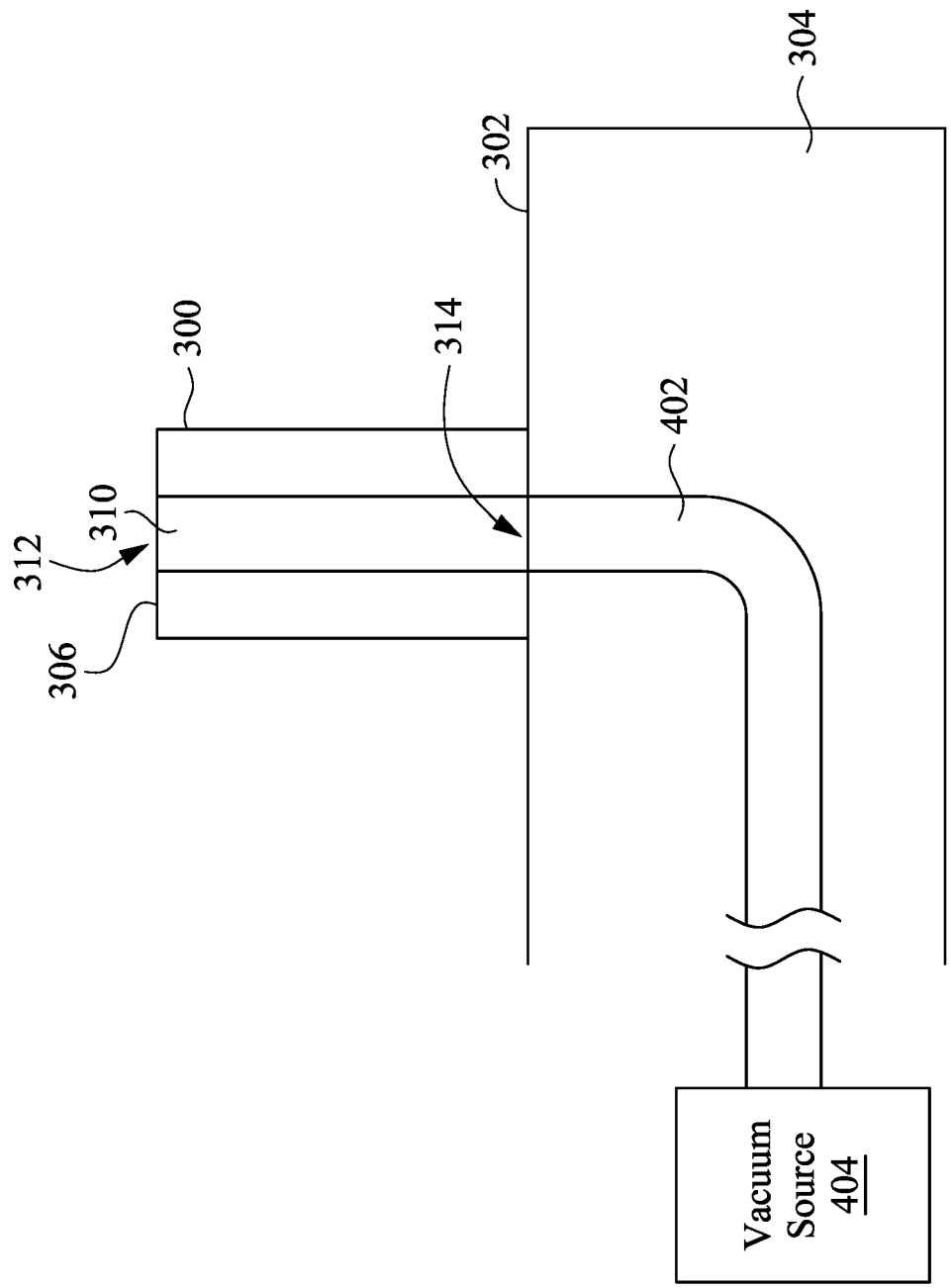
FIG. 4 illustrates an example column structure with a hollow internal space according to embodiments of the disclosure.

In some embodiments, at least some of the column structures 300 are riser structures that each is hollow with an internal space 310. FIG. 4 shows an enlarged view of a riser structure 300. As shown in FIG. 4, the internal space 310 extends throughout the riser/column structure 300 and includes an upper opening 312 and a lower opening 314. The upper opening 312 is at the upper surface 306 of the riser/column structure 300, where the workpiece 102 is held. The lower opening 314 is in fluidic communication with a channel 402 within the body 304 of the chunk 112. In some embodiment, the channel 402 is connected to a vacuum source 404. With fluidic communication to the vacuum source 404, a vacuum can be formed at the upper opening 312. The vacuum is configured to affix the workpiece 102 to the upper surface 306 of the riser/column structure 300. In some embodiments, the vacuum source 404 is controlled, e.g., by the controller 136, to generate variable vacuum values at upper openings 312 of different riser/column structures 300. The different vacuum values are used to selectively chunk the workpiece 102. The selective chunking of the workpiece 102 may be used to prevent warpage of the workpiece 102 or to clean the workpiece 102 on the blade 106. For example, the vacuum values are controlled so that the workpiece 102 are chunked by different portions thereof, details of which are further described herein.

Figure 5:
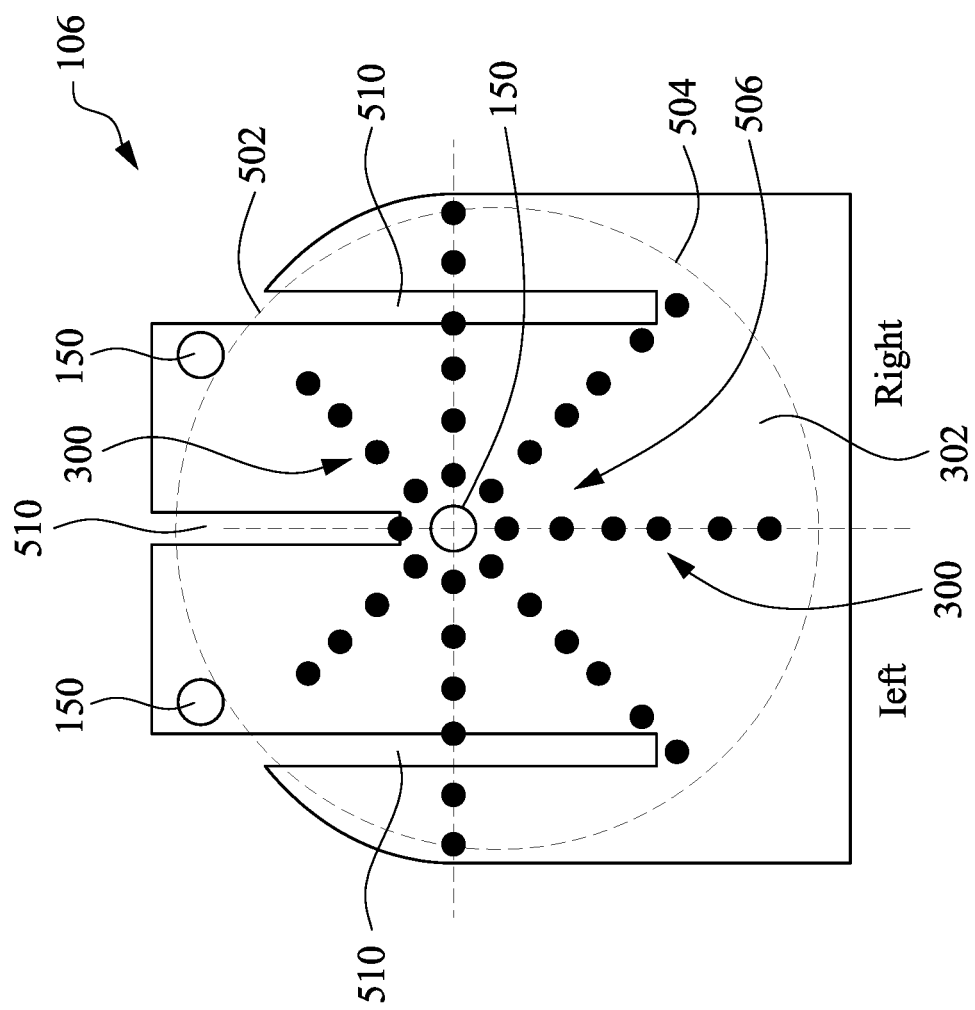
FIG. 5 illustrates a top view of an example blade having a plurality of column structures according to embodiments of the disclosure.

FIG. 5 is a top view of a blade 106. As shown in FIG. 5, the riser/column structures 300 are distributed on the surface 302 of the chunk body 304 in a pattern that enables stable support of the workpiece 102 (not shown in FIG. 5). FIG. 5 shows that the riser/column structures 300 are arranged in an asterial pattern within a workpiece retaining region 502 (shown in a dotted line) that the workpiece 102 is held. The riser/column structures 300 may be arranged in other patterns within the workpiece retaining region 502 provided that such patterns provide stable support to the workpiece 102.

In some embodiment, the alignment sensors 150, 152 (not shown in FIG. 5) are positioned within the workpiece retaining region 502. In some embodiments, as shown in FIG. 5, some (two shown as examples) of the workpiece alignment sensors 150 are positioned about a parameter line 504 of the workpiece retaining region 502. A workpiece alignment sensor 150 is positioned at about a center point 506 of the workpiece retaining region 502. In some embodiments, a holder alignment sensor 152 is positioned at about a center point 506 of the workpiece retaining region 502, but adjacent to the back surface 111 of the blade 106 (FIG. 2). Other positions of the workpiece alignment sensors 150 and/or the holder alignment sensors 152 are also possible and within the scope of the disclosure.

In some embodiments, the chunk body 304 also includes gaps 510 that enable lifters (not shown) of a holder to receive the workpiece 102 from the blade 106. Specifically, for example, the lifters will extend through the gaps 510 and lift the workpiece 102 off the blade 106.

Figure 6:
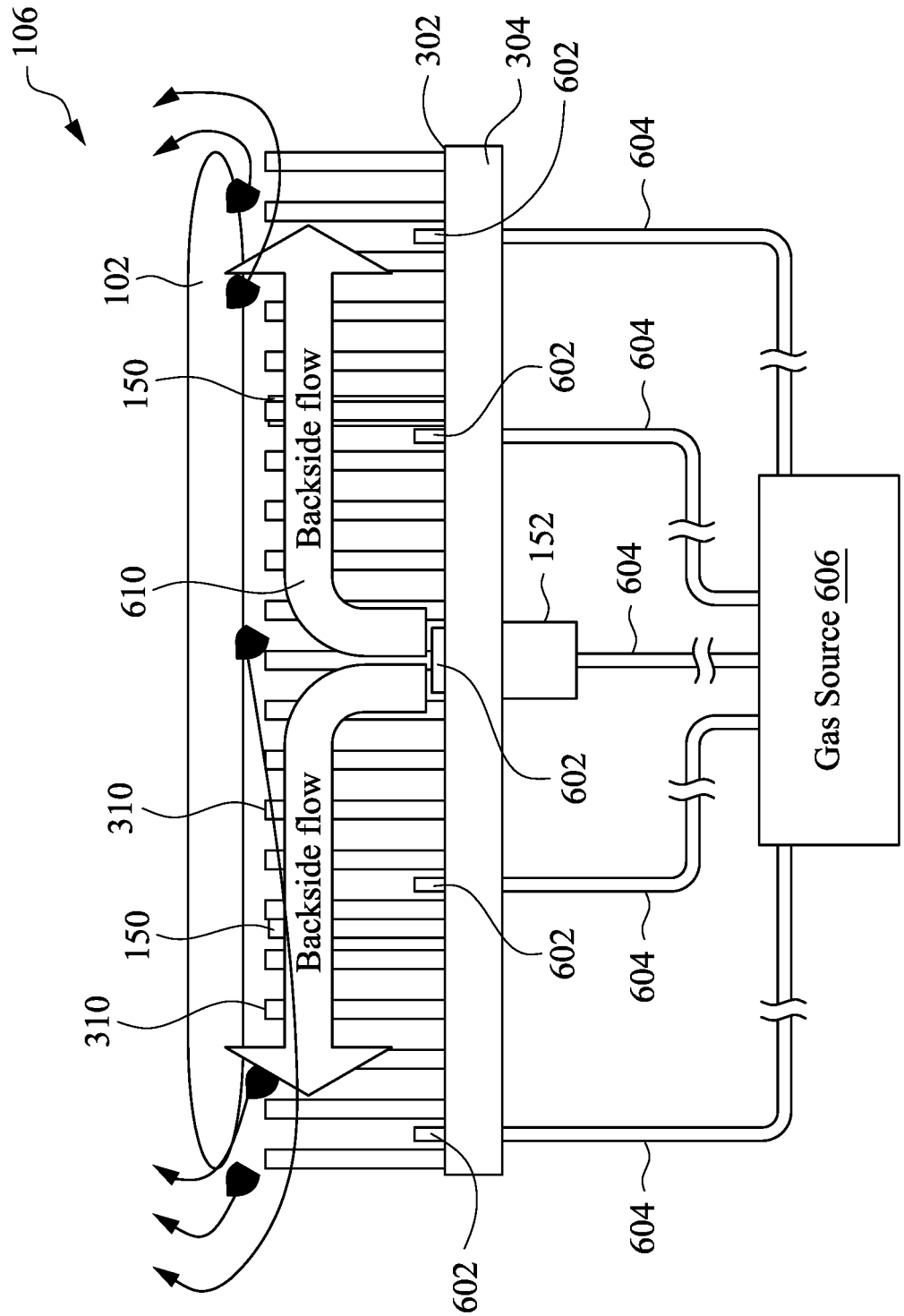
FIG. 6 illustrates an example blade having a plurality of gas outlets according to embodiments of the disclosure.

FIG. 6 shows some embodiments of the blade 106. As shown in FIG. 6, the blade 106 includes a plurality of gas outlets 602, e.g., nozzles, on and/or in the upper surface 302 of the chunk body 304. The gas outlets 602 are each in fluidic communication with a gas channel 604 that are connected to one or more gas source 606. The gas source 606 provides a gas, e.g., nitrogen, oxygen, or air, to the gas outlets 602 to be delivered out. The outlets 602 may be controlled, e.g., by the controller 136, to modify the flow rate, speed, direction, mass, shape, and/or the pressure of the stream of gas that emerges from the outlets 602. For example, the gas outlets 602 are configured to tilt to modify the directions of the gas stream 610 as illustratively shown in FIG. 6.

Figure 7B:
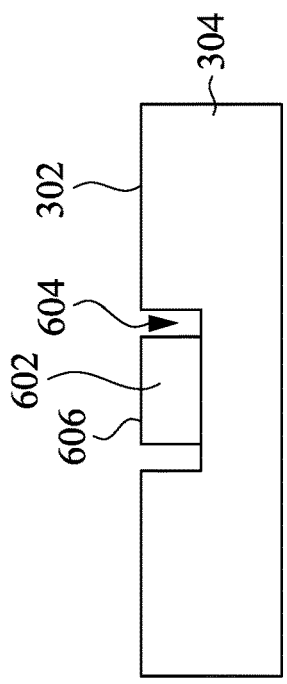
FIGS. 7A-7C illustrate example positions of gas outlets in a blade surface according to embodiments of the disclosure.
Figure 7C:
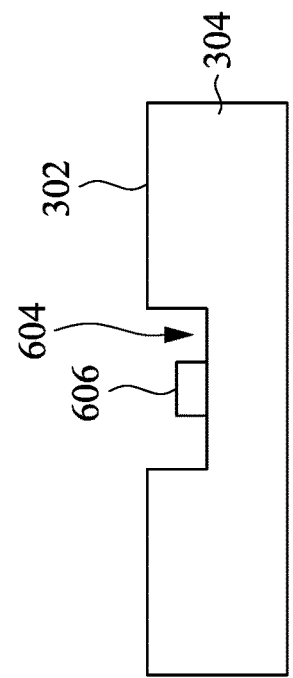
Figure 7A:
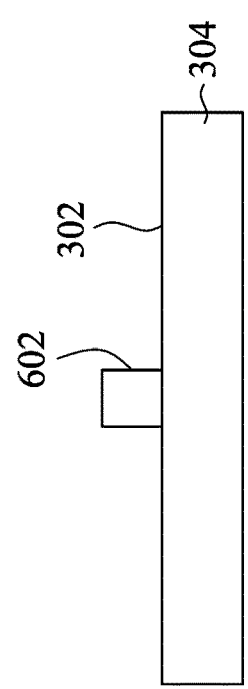

As shown in FIGS. 7A-7C, the gas outlets 602 may extend above and beyond the upper surface 302 of the chunk body 304 (FIG. 7A); may be positioned with an opening 604 on the upper surface 302 and with an upper surface 606 of the gas outlet 602 being substantially at a same level as the upper surface 302 (FIG. 7B); or may be positioned with an opening 604 on the upper surface 302 and with an upper surface 606 of the gas outlet 602 being lower than the upper surface 302 (FIG. 7C). Other structural configurations of the gas outlets 602 are also possible and within the scope of the disclosure.

Figure 8:
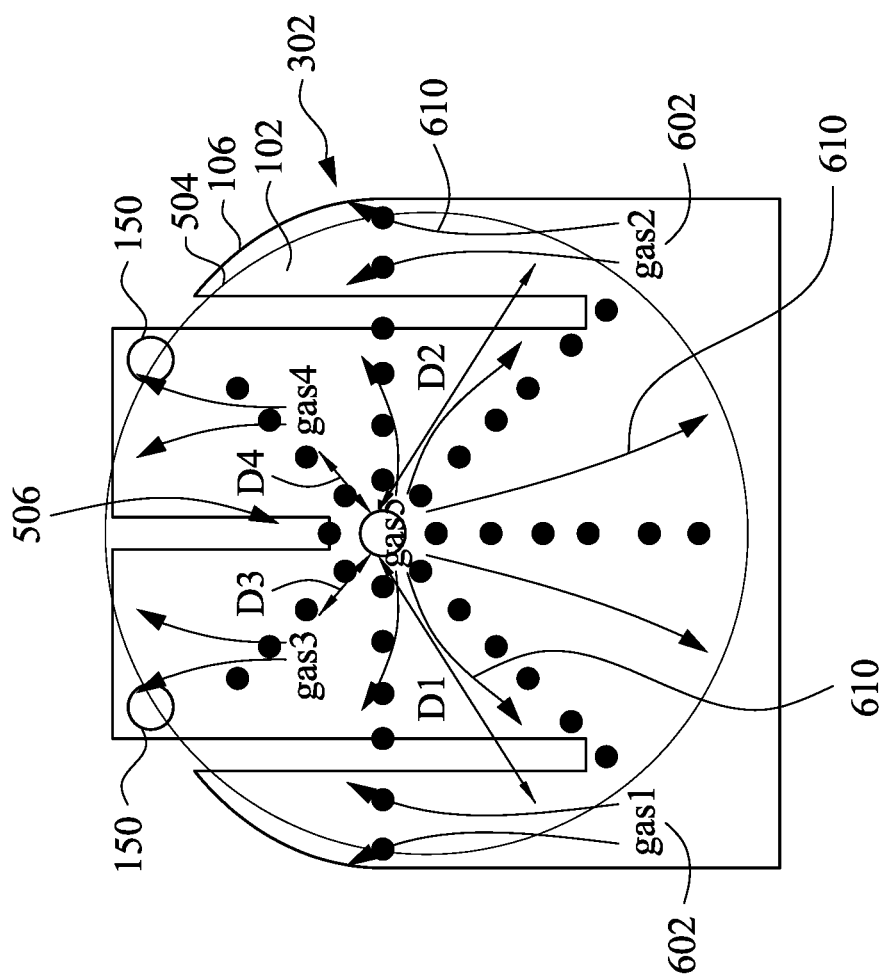
FIG. 8 illustrates an example allocation of gas outlets on a blade surface according to embodiments of the disclosure.

FIG. 8 shows a top view of the blade 106 having gas outlets 602. The workpiece 102 is positioned over the blade 106. As shown in FIG. 8, in some embodiments, the gas outlets 602 (gas 1, gas 2, gas 3, gas 4, gas 5 shown as examples) are arranged on different locations within the workpiece retaining region 502 (overlapping with the workpiece 102) on the upper surface 302 of the chunk body 304. The gas outlets 602 are also arranged with different distances from the center point 506 of the workpiece retaining region 502. For example, the gas outlets "gas 1" and "gas 2" are arranged about the perimeter 504 of the workpiece retaining region 502 and have distances D1, D2 to the center point 506. The gas outlet "gas 5" is arranged close to the center point 506 and has a distance D5 to the center point 506, which is substantially zero. The gas outlets "gas 3" and "gas 4" have distances D3, D4 to the center point 506, which are smaller than the distances D1 or D2 and are larger than the distance D5.

The allocation of the gas outlets 602 is configured such that the gas streams 610 exiting from the gas outlets 602 can reach all surface portions of the workpiece 102 held on the blade 106, specifically on the column/riser structures 300.

The embodiments of the FIGS. 1-8 may be used or exist separately or in various combinations, which are all included in the scope of the disclosure. For example, a blade 106 may include one or more of electrostatic chunking enabled by the electrodes 108 or vacuum chunking enabled by the hollow riser structure 300. A blade 106 may include both the electrostatic chunking and the vacuum chunking and may selectively use one of the two chunking mechanisms in different use scenarios.

Figure 9:
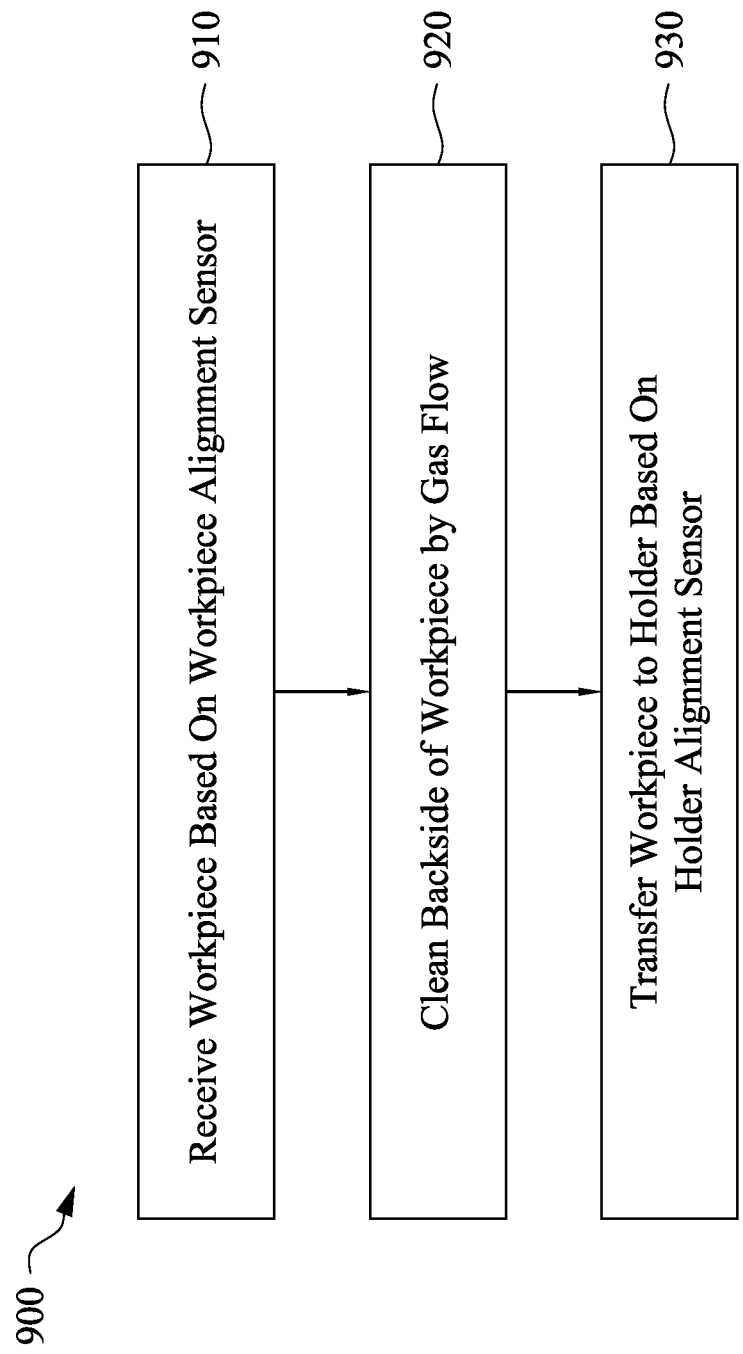
FIG. 9 illustrates an example process according to embodiments of the disclosure

FIG. 9 is a flow diagram of an example process 900. In example operation 910, the blade 106 receives a workpiece 102 on the workpiece retaining region 502. The positioning between the workpiece 102 and the workpiece retaining region 502 is calibrated at least partially based on the workpiece alignment sensors 150.

Figure 10E:
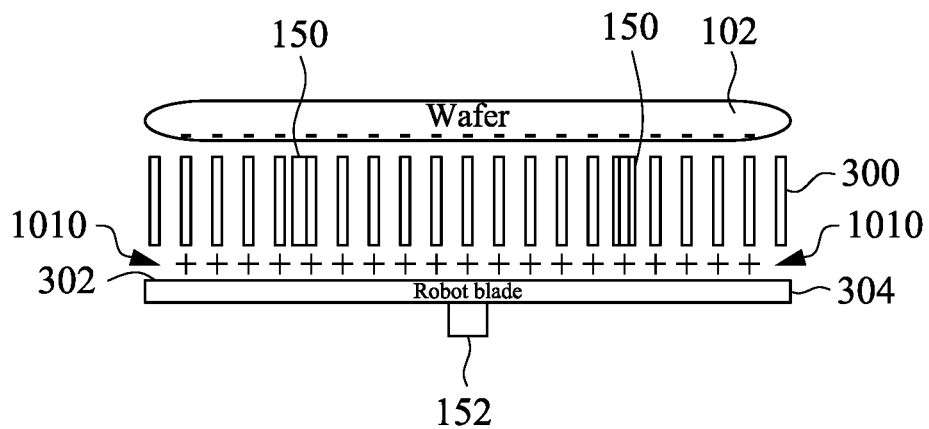

FIGS. 10A-10F illustrate details of the operation 910. In FIG. 10A, a workpiece 102 is transferred adjacent to the blade 106. For example, the workpiece is lifted hovering above the blade 106.

In FIG. 10B, the workpiece alignment sensors 150 calibrate alignment between retaining region 502 and the workpiece retailing region 502 in the x-axis direction. For example, the readings of the sensors 150(1), 150(2) may be received by the controller 136 to determine the alignment or misalignment between the workpiece 102 and the blade 106 in the x-axis direction, and to adjust one or more of the position of the workpiece 102 or the position of the blade 106 to improve the alignment therebetween.

In FIG. 10C, the workpiece alignment sensors 150 calibrate alignment between retaining region 502 and the workpiece retailing region 502 in the y-axis direction. For example, the reading of the sensor 150(3) may be received by the controller 136 to determine the alignment or misalignment between the workpiece 102 and the blade 106 in the y-axis direction, and to adjust one or more of the position of the workpiece 102 or the position of the blade 106 to improve the alignment therebetween.

In some embodiments, each of the workpiece alignment sensors 150 is used both for the x-axis alignment calibration and the y-axis alignment calibration. In some embodiments, a first subset of the workpiece alignment sensors 150, e.g., sensors 150(1) and 150(2), are used for the x-axis alignment calibration and a second subset of the workpiece alignment sensors 150, e.g., sensor 150(3), is used for the y-axis alignment calibration. The first subset of sensors 150 and the second subset of sensors 150 may partially overlap.

In some embodiments, the workpiece retaining region 502 of the blade 106 is adjustable and may be adjusted for different type of the workpieces 102 held by the blade 106. The alignment calibration between the workpiece 102 and the workpiece retaining region 502 is conducted based on the adjusted workpiece retaining region 502. The workpiece retaining region 502 and the alignment calibration may be controlled by a controller, e.g., the controller 136. For example, an offset value or distance between one or more of the sensors 150(10, 150(2), 150(3) on the blade 106 and the alignment marks on the workpiece 102, in the x-axis or the y-axis, may be adjusted based on the retaining region 502. Such adjusted offset values may be used to determine the alignment of the workpiece 102 to different workpiece retaining regions 502 on the blade 106.

In FIG. 10D, after the alignment calibration, the workpiece 102 is positioned on the retailing surface 110 of the blade 106. More specifically, in some embodiments, the workpiece 102 is positioned on the column/riser structures 300 of the blade 106.

Figure 10F:
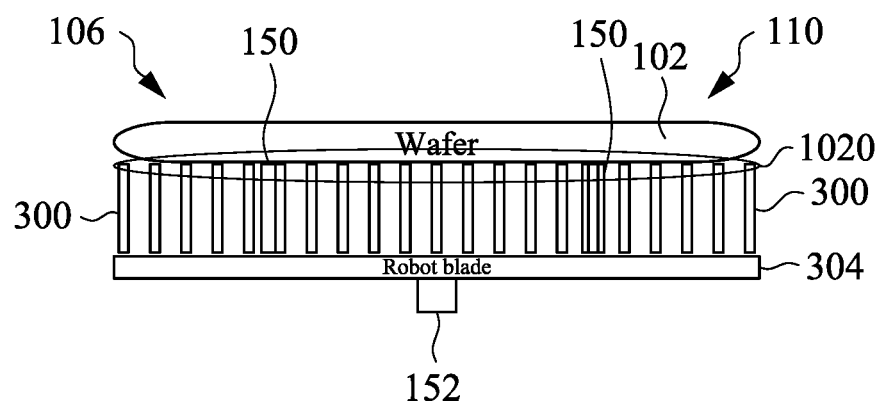

After the workpiece 102 is positioned with alignment on the blade 106, the workpiece 102 may be chunked or affixed to the blade 106 by one or more of electrostatic chunking (FIG. 10E) or vacuum chunking (FIG. 10F). In electrostatic chunking, the dielectric column/riser structures 300 functions as insulation means to insulate the workpiece 102 from the electrostatic charges 1010 on the surface 302 of the chunk body 304. In vacuum chunking, the hollow internal space 310 (not shown in FIG. 10F) of the dielectric column/riser structures 300 functions to create vacuum 1020 at the upper surface 110 of the blade 106 to attract the workpiece 102. In some embodiments, the controller 136 controls the chunking force, either in the electrostatic chunking or in the vacuum chunking, applied onto various portions of the workpiece 102 to achieve selective chunking.

Figure 11A:
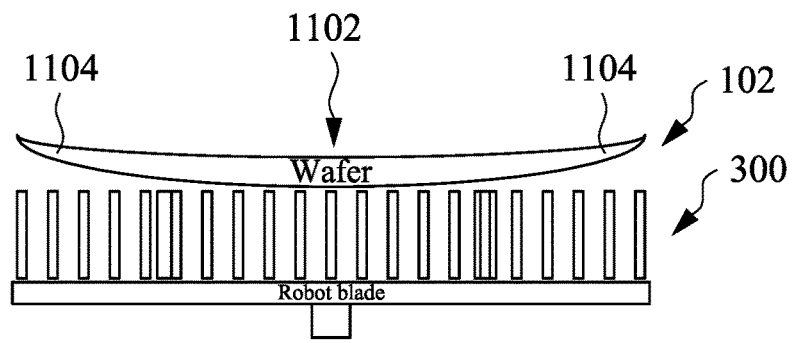
FIGS. 11A-11C illustrate examples of selective chunking of a wafer on a blade e according to embodiments of the disclosure.
Figure 11B:
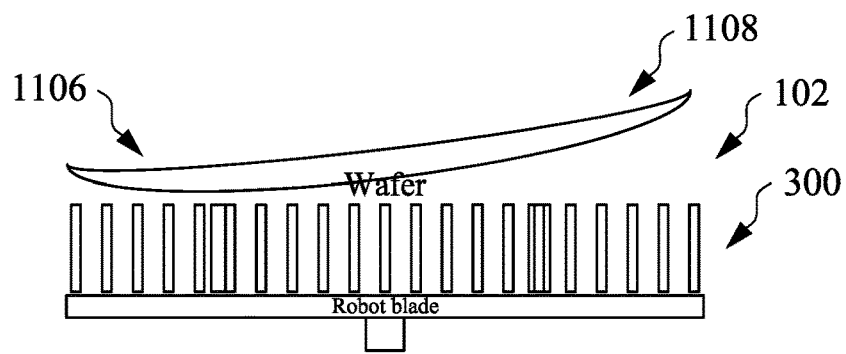
Figure 11C:
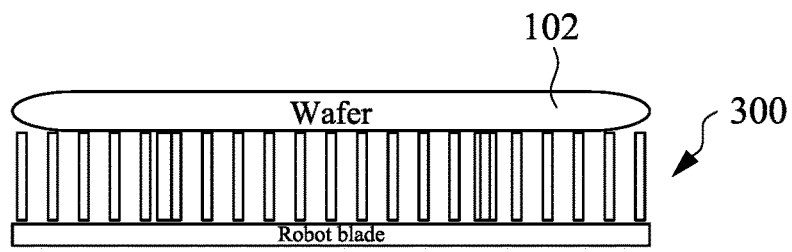

FIGS. 11A-11C show examples of selective chunking of the workpiece 102. Specifically, FIG. 11A shows that larger chunking force, e.g., electrostatic charges or vacuum force, is applied to the center portion of the workpiece 102 such that the center portion 1102 of the workpiece 102 is affixed to the respective column/riser structures 300. Smaller chunking force is applied to the peripheral portions 1104 of the workpiece 102 such that the peripheral portions 1104 is not affixed to the respective column/riser structures 300.

FIG. 11B shows that larger chunking force, e.g., electrostatic charges or vacuum force, is applied to the first zone 1106 of the workpiece 102 such that the first zone 1106 is affixed to the respective column/riser structures 300. Smaller chunking force is applied to the second zone 1108 of the workpiece 102 such that the second zone 1108 is not affixed to the respective column/riser structures 300.

FIG. 11C shows that sufficient chunking force, e.g., electrostatic charges or vacuum force, is applied to the whole workpiece 102 such that the workpiece 102 is fully affixed to the column/riser structures 300 of the blade 106.

The selective chunking of the workpiece 102 facilitates further operations on the workpiece 102 held over the blade 106. For example, the different chunked positions of the workpiece 102 may be used to facilitate a cleaning of the back surface of the workpiece 102 that is proximal to the blade 106.

Referring back to FIG. 9, in example operation 920, the backside of the workpiece 102 is cleaned by gas stream/flow exited from gas outlets 602. The flow rate, speed, direction, mass, shape, and/or the pressure of the gas stream from each of the gas outlet 602 may be individually controlled or modified to fit various workpiece cleaning scenarios.

Figure 12A:
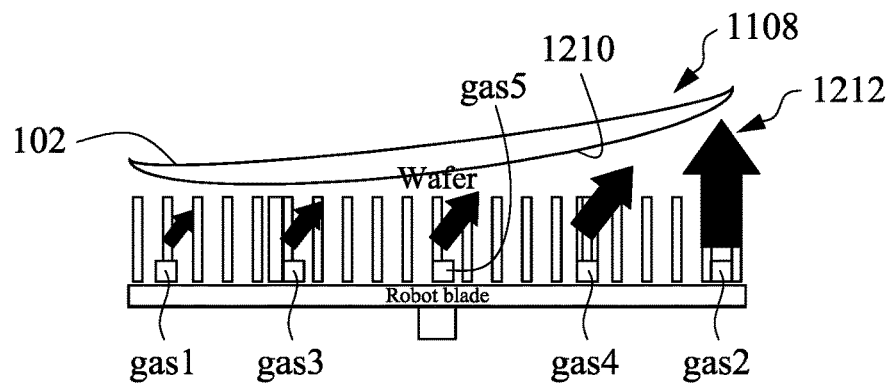
FIGS. 12A-12C illustrate example scenarios of cleaning a wafer using gas outlets on a blade according to embodiments of the disclosure.
Figure 12B:
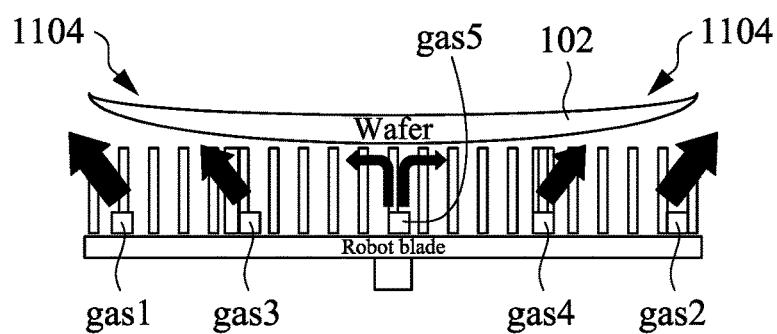
Figure 12C:
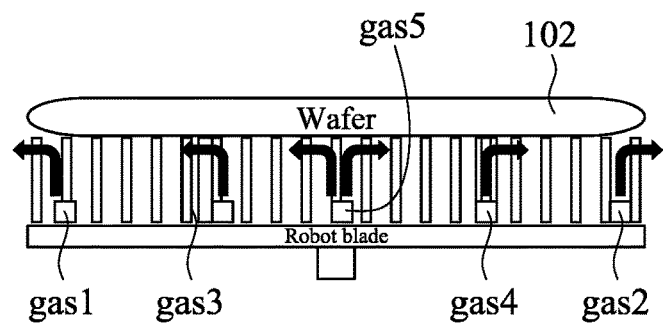

FIGS. 12A-12C show example workpiece cleaning scenarios. In FIG. 12A, the gas streams are directed toward a same zone of the workpiece 102, e.g., the second zone 1108. The workpiece 102 is selectively chunked such that the second zone 1108 is not affixed to the respective column/riser structures 300 to facilitate the cleaning. Such zone based chunking and the selected directions of the gas streams help to remove particles or other foreign objects on the back surface of the whole back surface 1210 of the workpiece 102 through the enlarged gap 1212 between the workpiece 102 and the blade 106 underneath the zone 1108 that is not affixed to the blade 106. The gas outlet "gas 2" that is vertically further from the workpiece 102 is controlled to deliver a larger gas stream with a high pressure. The gas outlet "gas 1" that is closer to the workpiece 102 is controlled to deliver a smaller gas stream with a lower pressure.

In FIG. 12B, the workpiece 102 is center-chunked and the gas streams are directed toward the peripheral portions 1104 of the workpiece 102.

In FIG. 12C, the workpiece 102 is fully chunked and the gas streams are controlled to flow through the whole back surface 1210 of the workpiece 102. FIG. 8 shows as an illustration that the gas stream 610 of the gas outlets 602 may be controlled to flow in various directions to ensure that the whole back surface 1210 of the workpiece 102 is reached.

The examples of FIG. 12 are related to the examples of FIG. 11 for illustrative purposes. It should be appreciated that the gas outlets 602 may be controlled in different manners from the examples of FIG. 12 and the gas outlets 602 may be controlled for different cleaning scenarios from the selective chunking positions shown in FIG. 11. Also, the workpiece 102 may be selectively chunked over the blade 106 for different purposes other than the gas cleaning.

Referring back to FIG. 9, in example operation 930, after the gas cleaning, the robot 104 transfers the workpiece 102 to a holder, with position alignment calibrated based on the holder alignment sensor(s) 152.

Figure 13A:
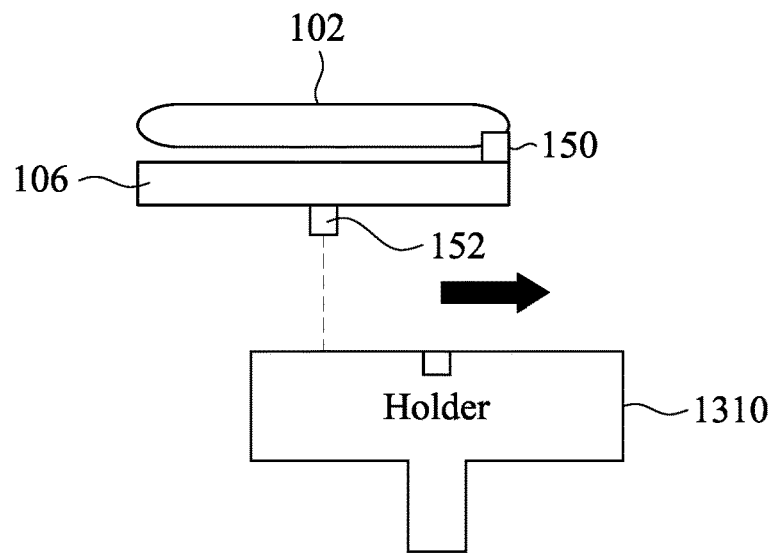
FIGS. 13A-13D illustrates steps of transferring a wafer from a blade to a holder according to embodiments of the disclosure.

FIGS. 13A-13D show example details of the operation 930. In FIG. 13A, the robot 104 transfers the workpiece 102 about a holder 1310, e.g., of a chamber.

Figure 13B:
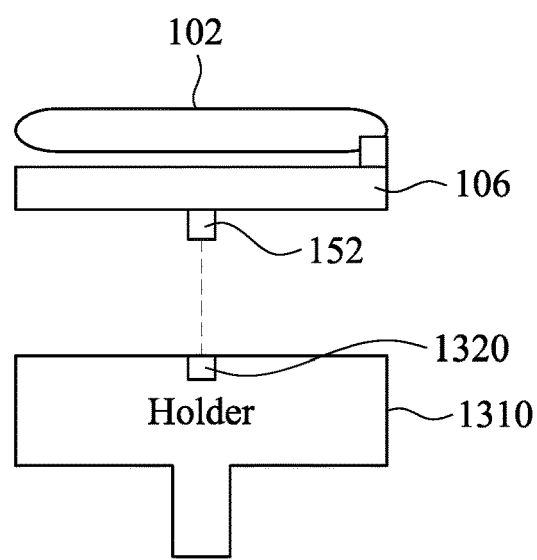

In FIG. 13B, the holder alignment sensor 152 calibrates the alignment between the blade 106 and the holder 1310. For example, the holder alignment sensor 152 is aligned to a sensor 1320 on the holder 1310. The alignment calibration between the blade 106 and the holder 1310 may be controlled and adjusted by the controller 136.

Figure 13C:
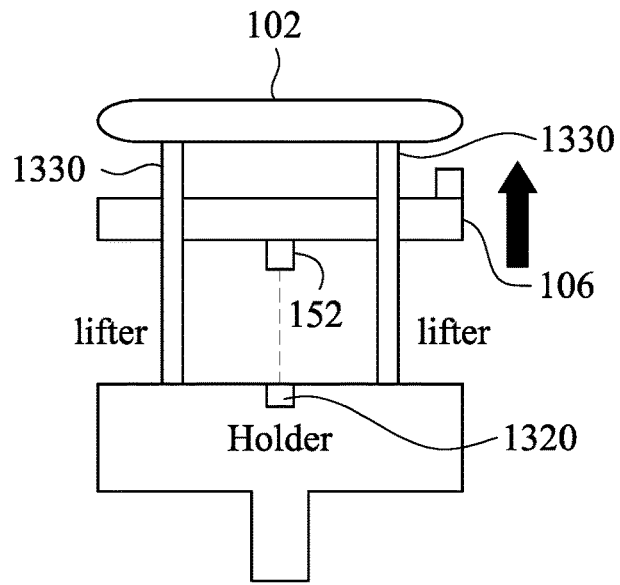

In FIG. 13C, lifters 1330 extend through the gaps 510 (not shown in FIG. 13) of the blade 106 and lift off the workpiece 102 from the blade 106.

Figure 13D:
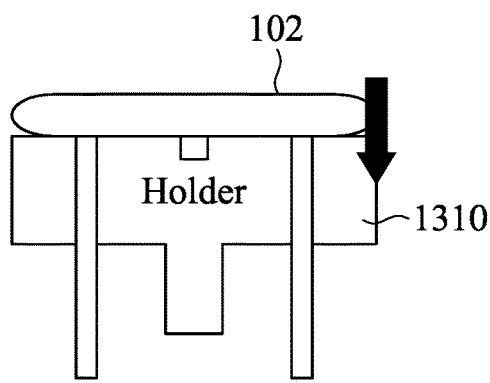

In FIG. 13D, the blade 106 is removed and the lifters 1330 retract to position the workpiece 102 on the holder 1310.

The foregoing outlines features of several embodiments so that those skilled in the art may better understand the aspects of the present description. Those skilled in the art should appreciate that they may readily use the present description as a basis for designing or modifying other processes and structures for carrying out the same purposes and/or achieving the same advantages of the embodiments introduced herein. Those skilled in the art should also realize that such equivalent constructions do not depart from the spirit and scope of the present description, and that they may make various changes, substitutions, and alterations herein without departing from the spirit and scope of the present description.

In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The present disclosure may be further appreciated with the description of the following embodiments:

In some embodiments, a robot includes a controller; an arm; and a blade coupled to the arm. The blade has a first surface and a second surface that is opposite to the first surface, a first alignment sensor positioned on or in the first surface of the blade and communicatively coupled to the controller; and a second alignment sensor positioned on or in the second surface of the blade and communicatively coupled to the controller.

In some embodiments, a blade of a robot includes a chunk body having a first surface and a second surface that is opposite to the first surface; a plurality of column structures extending vertically from the first surface of the chunk body; and a first alignment sensor in or on the second surface of the chunk body.

In some embodiments, a method includes aligning a blade of a robot with a wafer using a first sensor of the blade; positioning the wafer on the blade with chunking; cleaning the wafer using a gas delivered through a gas outlet in the blade; aligning the blade with a wafer holder using a second sensor of the blade; and positioning the wafer on the holder.

These and other changes can be made to the embodiments in light of the above detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A robot system for transferring wafer in a semiconductor manufacturing process, comprising:
   a controller;
   an arm;
   a power source;
   a blade including a chunk body coupled to the arm, the blade having a first surface and a second surface that is opposite to the first surface;
   a first alignment sensor positioned adjacent to the first surface of the blade and communicatively coupled to the controller, the first alignment sensor configured to sense alignment with an object along a first direction that transverses the first surface; and
   a second alignment sensor positioned adjacent to the second surface of the blade and communicatively coupled to the controller, the second alignment sensor configured to sense alignment with the object along a second direction that transverses the second surface;
   wherein the chunk body includes a first electrode and a second electrode embedded under the first surface, when each coupled to the power source, the first electrode generating a first amount of electrostatic charge on a first surface region of the first surface of the chunk body, and the second electrode generating a second amount of electrostatic charge on a second surface region of the first surface of the chunk body, the first amount capable of being different from the second amount.

2. The robot system of claim 1, wherein the blade further includes a plurality of discrete column structures each extending vertically from a third surface of the chunk body of the blade until a first surface of the discrete column that is distal to the chunk body of the blade, first surfaces of the plurality of the discrete columns forming the surface of the blade that interfaces with a workpiece.

3. The robot system of claim 2, wherein a first column structure of the plurality of column structures includes a hollow internal space, and the hollow internal space is in fluidic communication with a vacuum source to generate a vacuum force at the first surface of the first column structure.

4. The robot system of claim 3, wherein the controller controls a value of the vacuum force.

5. The robot system of claim 2, wherein the plurality of column structures are dielectric.

6. The robot system of claim 2, wherein the blade further includes a plurality of gas outlets in or on the third surface of the chunk body, each of the plurality of gas outlet in fluidic communication with a gas source.

7. The robot system of claim 6, wherein the plurality of gas outlets are each structured to deliver a gas stream in multiple directions with respect to the workpiece positioned on the first surface of the blade.

8. The robot system of claim 1, wherein the blade including the chuck body having a third surface opposite to the second surface of the blade, the chunk body including a third electrode embedded under the third surface, the third electrode, when coupled to the power source, generating electrostatic charges on the third surface.

9. The robot system of claim 8, wherein the controller controls the first electrode, the second electrode and the third electrode to generate various amounts of electrostatic charges.

10. A robot system for transferring wafer in a semiconductor manufacturing process, comprising:
    a controller;
    an arm;
    a blade including a chunk body coupled to the arm, the blade having a first surface and a second surface that is opposite to the first surface;
    a first alignment sensor positioned adjacent to the first surface of the blade and communicatively coupled to the controller; and
    a second alignment sensor positioned adjacent to the second surface of the blade and communicatively coupled to the controller,
    wherein in operation, the controller is configured to conduct acts including: aligning the blade of the robot with a wafer along a first direction that transverses the first surface based on a reading of the first alignment sensor of the blade;
    positioning the wafer on the blade;
    aligning the blade with a wafer holder along a second direction that transverses the second surface based on a reading of the second sensor of the blade; and
    positioning the wafer on the wafer holder;
    wherein the chunk body includes a first electrode and a second electrode embedded under the first surface, when each coupled to a power source, the first electrode generating a first amount of electrostatic charge on a first surface region of the first surface of the chunk body, and the second electrode generating a second amount of electrostatic charge on a second surface region of the first surface of the chunk body, the first amount capable of being different from the second amount.

11. The robot system of claim 10, comprising a chunking system coupled to the blade, the chunking system configured to apply a first chunking force on a first portion of the wafer on the blade and apply a second chunking force on a second portion of the wafer on the blade.

12. The robot system of claim 10, wherein the blade includes a gas outlet configured to deliver a gas toward a portion of the wafer on the blade.

\* \* \* \* \*